(12) United States Patent
Tietze et al.

(10) Patent No.: US 9,512,333 B2
(45) Date of Patent: Dec. 6, 2016

(54) PHOSPHORIC ACID RESISTANT POLYMALEIMIDE PREPOLYMER COMPOSITIONS

(71) Applicant: Huntsman Advanced Materials Americas LLC, The Woodlands, TX (US)

(72) Inventors: Roger Tietze, The Woodlands, TX (US); Yen-Loan Nguyen, Spring, TX (US)

(73) Assignee: Huntsman Advanced Materials Americas LLC, The Woodlands, TX (US)

(*) Notice: Subject to any disclaimer, the term of this patent is extended or adjusted under 35 U.S.C. 154(b) by 43 days.

(21) Appl. No.: 13/865,289

(22) Filed: Apr. 18, 2013

(65) Prior Publication Data

US 2013/0231021 A1 Sep. 5, 2013

Related U.S. Application Data

(63) Continuation of application No. 13/256,269, filed as application No. PCT/US2010/027418 on Mar. 16, 2010, now Pat. No. 8,445,699.

(60) Provisional application No. 61/160,830, filed on Mar. 17, 2009.

(51) Int. Cl.
| | |
|---|---|
| *C09D 179/08* | (2006.01) |
| *C08F 22/40* | (2006.01) |
| *H05K 1/03* | (2006.01) |

(52) U.S. Cl.
CPC ........... *C09D 179/085* (2013.01); *C08F 22/40* (2013.01); *H05K 1/0346* (2013.01); *Y10T 442/2574* (2015.04)

(58) Field of Classification Search
CPC . C08F 22/40; C09D 179/085; C09D 179/08; Y10T 442/2574

USPC ........................................................ 442/129
See application file for complete search history.

(56) References Cited

U.S. PATENT DOCUMENTS

| | | | |
|---|---|---|---|
| 3,658,764 A | 4/1972 | Bargain et al. | |
| 3,741,942 A | 6/1973 | Crivello | |
| 3,764,573 A * | 10/1973 | Jablonski | C08J 5/24 |
| | | | 524/108 |
| 4,038,251 A | 7/1977 | Forgo et al. | |
| 4,065,433 A | 12/1977 | Muller et al. | |
| 4,100,140 A | 7/1978 | Zahir et al. | |
| 4,298,720 A | 11/1981 | Yamazaki et al. | |
| 4,525,572 A | 6/1985 | Diethelm et al. | |
| 5,130,444 A | 7/1992 | Horacek et al. | |
| 5,189,128 A | 2/1993 | Maw et al. | |
| 5,391,664 A | 2/1995 | Takei et al. | |
| 5,484,948 A | 1/1996 | Yamaguchi et al. | |
| 5,525,704 A | 6/1996 | Tamai et al. | |
| 5,637,387 A | 6/1997 | Chin et al. | |

OTHER PUBLICATIONS

Mognonov et al., Inhibition of polymerization of polybismaleimides in solution, Russian Journal of Applied Chemistry, vol. 77, No. 7, 2004, pp. 1206-1207.*

* cited by examiner

*Primary Examiner* — Jennifer Chriss
*Assistant Examiner* — Camie Thompson
(74) *Attorney, Agent, or Firm* — Huntsman International LLC

(57) ABSTRACT

The present invention relates to a phosphoric acid resistant advanced polymaleimide prepolymer composition including a polymaleimide prepolymer resulting from the advancement reaction of a polyimide and an alkenylphenol, alkenylphenol ether or mixture thereof in the presence of an amine catalyst; a solvent and a heteropolyacid. The phosphoric acid resistant advanced polymaleimide prepolymer composition may be used in various applications such as prepregs, laminates, printed circuit boards, castings, composites, molded articles, adhesives and coatings.

8 Claims, No Drawings

PHOSPHORIC ACID RESISTANT POLYMALEIMIDE PREPOLYMER COMPOSITIONS

CROSS-REFERENCE TO RELATED APPLICATION

This application is a continuation application of U.S. patent application Ser. No. 13/256,269, pending, which is the National Phase of International Application PCT/US2010/027418 filed Mar. 16, 2010, which designated the U.S. and which was published in English and which claims priority to U.S. Pat. App. Ser. No. 61/160,830 filed Mar. 17, 2009. The noted applications are incorporated herein by reference.

STATEMENT REGARDING FEDERALLY SPONSORED RESEARCH OR DEVELOPMENT

Not applicable.

FIELD OF THE INVENTION

The present invention is directed to phosphoric acid resistant advanced polymaleimde prepolymer compositions and products, such as prepreg products, produced therefrom. The phosphoric acid resistant advanced polymaleimide prepolymer compositions include: (i) a polymaleimide prepolymer resulting from the advancement reaction of a polyimide and an alkenylphenol or alkenylphenol ether in the presence of an amine catalyst; (ii) a solvent; and (iii) a heteropolyacid.

BACKGROUND OF THE INVENTION

Bimaleimides may be used as raw materials for the manufacture of polyaddition and polymerization products. For example, U.S. Pat. No. 3,658,764 discloses polyaddition products produced from unsaturated bismaleimides and amines; U.S. Pat. No. 3,741,942 describes the manufacture of polyaddition products from bismaleimides and organic dithiols; U.S. Pat. Nos. 4,038,251 and 4,065,433 describe the reaction of bismaleimides with polyhydric phenols and polyhydric alcohols in the presence of a catalyst to form the polyaddition products; and U.S. Pat. No. 4,100,140 describes polyaddition products prepared from bismaleimides and alkenylphenols or alkenylphenol ethers.

Because of their thermal stability and good mechanical properties, polyaddition products produced from bismaleimides may be used in various prepreg applications. One such polyaddition product, supplied as a powder, is the reaction product of bismaleimidodiphenyl methane and methylene dianiline. The powder polyaddition product may then be dissolved in a high boiling solvent, such as N-methylpyrrolidone, for prepreg use. The stability of such a solution however is limited due to rapidly occurring precipitation and viscosity increase upon standing. Therefore, formulation of the solution must occur immediately prior to use.

Improvements have been noted in the polyaddition products and solutions disclosed in U.S. Pat. Nos. 5,189,128 and 5,637,387. U.S. Pat. No. 5,189,128 discloses a polyaddition product produced from the reaction of polymaleimide and alkenylphenol or alkenylphenol ether in the presence of specific molar amounts of basic catalyst for certain reaction times and at certain reaction temperatures. The resulting product exhibits improved solubility in the lower boiling solvent methyl ethyl ketone and improved storage stability as evidenced by an absence of precipitation. A further improvement in storage stability is described in U.S. Pat. No. 5,637,387 where phenothiazine or hydroquinone is added after the polymaleimide has reacted with the alkenylphenol or alkenylphenol ether.

It is an object of the present invention to provide an improved polyaddition product composition which exhibits resistance to acids, and in particular, phosphoric acid, without any adverse impact on the thermal and mechanical properties of the prepreg products made therefrom.

SUMMARY OF THE INVENTION

The present invention relates to a phosphoric acid resistant advanced polymaleimide prepolymer composition comprising:
(a) a polymaleimide prepolymer resulting from the advancement reaction of a polyimide and an alkenylphenol, alkenylphenol ether or mixture thereof in the presence of an amine catalyst;
(b) a solvent; and
(c) a heteropolyacid.

The phosphoric acid resistant advanced polymaleimide prepolymer composition may be prepared by reacting at an elevated temperature a polyimide and an alkenylphenol, an alkenylphenol ether or mixture thereof, in the presence of an amine catalyst to form the polymaleimide prepolymer, substantially removing all of the amine catalyst; and subsequently adding a solvent and heteropolyacid. In another embodiment, a prepreg or laminate structure may be prepared by curing a fabric or fiber impregnated with the phosphoric acid resistant advanced polymaleimide prepolymer composition of the present invention.

DETAILED DESCRIPTION OF THE INVENTION

The phosphoric acid resistant advanced polymaleimide prepolymer composition generally includes (i) a polymaleimide prepolymer resulting from the advancement reaction of a polyimide and an alkenylphenol, alkenylphenol ether or mixture thereof in the presence of an amine catalyst; (ii) a solvent; and (iii) a heteropolyacid. It has been surprisingly discovered that the addition of solvent and heteropolyacid to the polymaleimde prepolymer allows the prepolymer to exhibit resistance to acidic environments, especially highly concentrated phosphoric acidic environments. The phosphoric acid resistant advanced polymaleimide prepolymer composition of the present invention may be exposed to acidic environments at room temperature or temperatures even higher than room temperature for a prolonged period of time without adverse effects. By "room temperature" it is meant a temperature of about 20° C.

Applicable polyimides contain at least two radicals of the formula

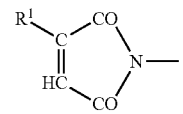

where $R^1$ is hydrogen or methyl.

In another embodiment, the polyimide is a polymaleimide, preferably a bismaleimide of the formula

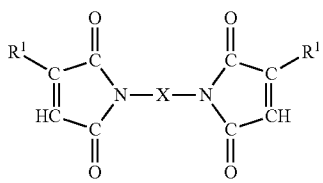

where $R^1$ is hydrogen or methyl and X is —$C_nH_{2n}$— with n=2 to 20, —$CH_2CH_2SCH_2CH_2$—, phenylene, naphthalene, xylene, cyclopentylene, 1,5,5-trimethyl-1,3-cyclohexylene, 1,4-cyclohexylene, 1,4-bis-(methylene)-cyclohexylene, or groups of the formula (a)

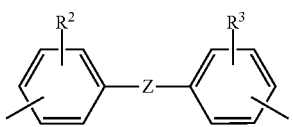

(a)

where $R^2$ and $R^3$ independently are chlorine, bromine, methyl, ethyl, or hydrogen and Z is a direct bond, methylene, 2,2-propylidene, —CO—, —O—, —S—, —SO— or —$SO_2$—. Preferably, $R^1$ is methyl, X is hexamethylene, trimethylhexamethylene, 1,5,5-trimethyl-1,3-cyclohexylene or a group of the indicated formula (a) in which Z is methylene, 2,2-propylidene or —O— and $R^2$ and $R^3$ are hydrogen.

Examples of polyimides include: N,N'-ethylene-bismaleimide, N,N'-hexamethylene-bismaleimide, N,N'-m-phenylene-bismaleimide, N,N'-p-phenylene-bismaleimide, N,N'-4,4'-diphenylmethane-bismaleimide, N,N'-4,4'-3,3'-dichloro-diphenylmethane-bismaleimide, N,N'-4,4'-(diphenylether)-bismaleimide, N,N'-4,4'-di-phenylsulphone-bismaleimide, N,N'-4,4'-dicyclohexylmethane-bismaleimide, N,N'-α,4,4'-dimethylenecyclohexane-bismaleimide, N,N'-m-xylene-bismaleimide, N,N'-p-xylene-bismaleimide, N,N'-4,4'-diphenylcyclohexane-bismaleimide, N,N'-m-phenylene-biscitraconimide, N,N'-4,4'-diphenylmethane-biscitraconimide, N,N'-4,4'-2,2-diphenylpropane-bismaleimide, N,N'-α, 1,3-dipropylene-5,5-dimethyl-hydantoin-bismaleimide, N,N'-4,4'-diphenylmethane-bisitaconimide, N,N'-p-phenylene-bisitaconimide, N,N'-4,4'-diphenylmethane-bisdimethylmaleimide, N,N'-4,4'-2,2'-diphenylpropane-bisdimethylmaleimide, N,N'-hexamethylene-bisdimethylmaleimide, N,N'-4,4'-(diphenylether)-bisdimethylmaleimide and N,N'-4,4'-diphenylsulphone-bisdimethylmaleimide.

Applicable alkenylphenols and alkenylphenol ethers may include allylphenols, methallylphenols or ethers thereof. Preferably, the alkenylphenol and alkenylphenol ether is a compound of the formulae (1)-(4):

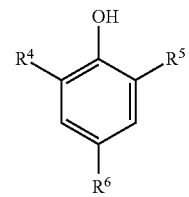

(1)

where R is a direct bond, methylene, ispopropylidene, —O—, —S—, —SO— or —$SO_2$—;

(2)

where $R^4$, $R^5$ and $R^6$ are each independently hydrogen or a $C_2$-$C_{10}$ alkenyl, preferably an allyl or propenyl, with the proviso that at least one of $R^4$, $R^5$ or $R^6$ is a $C_2$-$C_{10}$ alkenyl;

(3)

where $R^4$, $R^5$, $R^6$ and $R^7$ are each independently hydrogen or a $C_2$-$C_{10}$ alkenyl, preferably an allyl or alkenyl, with the proviso that at least one of $R^4$, $R^5$, $R^6$ or $R^7$ is a $C_2$-$C_{10}$ alkenyl and R is defined as in formula (1) and (4)

where $R^8$, $R^9$, $R^{10}$, $R^{11}$, $R^{12}$ and $R^{13}$ are each independently hydrogen, $C_1$-$C_4$ alkyl, and $C_2$-$C_{10}$ alkenyl, preferably allyl or propenyl, with the proviso that at least one of $R^8$, $R^9$, $R^{10}$, $R^{11}$, $R^{12}$ and $R^{13}$ is a $C_2$-$C_{10}$ alkenyl and b is an integer from 0 to 10. It is also possible to use mixtures of compounds of the formulae (1)-(4).

Examples of alkenylphenol and alkenylphenol ether compounds include: O,O'-diallyl-bisphenol A, 4,4'-dihydroxy-3,3'-diallyldiphenyl, bis(4-hydroxy-3-allylphenyl)methane, 2,2-bis(4-hydroxy-3,5-diallylphenyl)propane, O,O'-dimethallyl-bisphenol A, 4,4'-dihydroxy-3,3'-dimethallyldiphenyl, bis(4-hydroxy-3-methallylphenyl)methane, 2,2-bis(4-hydroxy-3,5-dimethallylphenyl)-propane, 4-methallyl-2-methoxyphenol, 2,2-bis(4-methoxy-3-allylphenyl)propane, 2,2-bis(4-methoxy-3-methallylphenyl)propane, 4,4'-dimethoxy-3,3'-diallyldiphenyl, 4,4'-dimethoxy-3,3'-dimethallyldiphenyl, bis(4-methoxy-3-allylphenyl)methane, bis(4-methoxy-3-methallylphenyl)methane, 2,2-bis(4-methoxy-3,5-diallylphenyl)propane, 2,2-bis(4-methoxy-3,5-dimethallylphenyl)propane, 4-allylveratrole and 4-methallyl-veratrole.

The alkenylphenol, alkenylphenol ether or mixture thereof may be employed in a range of between about 0.05 moles-2.0 moles per mole of polyimide. In another embodiment, the alkenylphenol, alkenylphenol ether or mixture thereof may be employed in a range of between about 0.1 moles-1.0 mole per mole of polyimide.

Applicable amine catalysts include tertiary, secondary and primary amines or amines which contain several amino groups of different types and quaternary ammonium compounds. The amines may be either monoamines or polyamines and may include: diethylamine, tripropylamine, tributylamine, triethylamine, triamylamine, benzylamine, tetramethyl-diaminodiphenylmethane, N,N-diisobutylaminoacetonitrile, N,N-dibutylaminoacetonitrile, heterocyclic bases, such as quinoline, N-methylpyrrolidine, imidazole, benzimidazole and their homologues, and also mercaptobenzothiazole. Examples of suitable quaternary ammonium compounds which may be mentioned are benzyltrimethylammonium hydroxide and benzyltrimethylammonium methoxide. Tripropylamine is preferred.

The amine catalyst may be employed in a range of between about 0.1%-10% by weight of amine catalyst per total weight of the advancement reactants. In another embodiment, the amine catalyst present may be employed in a range of between about 0.2%-5% by weight of amine catalyst per total weight of the advancement reactants.

The method of preparation of the polymaleimide prepolymer includes blending the polyimide and the alkenylphenol, alkenylphenol ether or mixture thereof and heating the blend to a temperature of about 25° C.-150° C. until a clear melt is obtained. The amine catalyst may then be added and the reaction continued for an appropriate amount of time at a temperature of about 100° C.-140° C. whereupon all of the amine catalyst is removed under vacuum. The degree of advancement may be monitored by measuring resin melt viscosity using a 0-100 poise scale at 125° C. and may range from 20-90 poise for the advanced polymaleimide prepolymer. Gel time may also be used as an additional parameter and reflects the time to total gel formation as determined at a temperature of about 170° C.-175° C. and may range from 300 seconds-2000 seconds.

The phosphoric acid resistant advanced polymaleimide prepolymer composition further includes a solvent. The solvent may be a low boiling solvent (boiling points up to about 160° C. and preferably up to about 100° C.) including ketones such as acetone, methyl ethyl ketone and methyl isobutyl ketone; glycol ethers and glycol ether acetates such as propylene glycol monomethyl ether, propylene glycol methyl ether acetate, ethylene glycol methyl ether, ethylene glycol ethyl ether and glycol ethyl ether acetate; hydrocarbons such as toluene and anisole; methoxy propanol; dimethylformamide; and mixtures thereof.

The solvent may be employed in a range of between about 10%-50% by weight based on the total weight of the phosphoric acid resistant advanced polymaleimide prepolymer composition. In another embodiment, the solvent may be employed in a range of between about 17.5%-40% by weight, preferably between about 20%-30% by weight, based on the total weight of the advanced polymaleimide prepolymer composition.

The phosphoric acid resistant advanced polymaleimide prepolymer composition further includes a heteropolyacid. The heteropolyacid is an oxygen acid with P, As, Si, or B as central atoms which are connected with W, Mo or V via oxygen bridges. Examples of such acids are tungsten and molybdenum phosphoric acid and tungsten and molybdenum arsenic acid. Preferred is phosphotungstic acid hydrate.

The heteropolyacid may be employed in a range of between about 0.0001%-10% by weight based on the total weight of the phosphoric acid resistant advanced polymaleimide prepolymer composition. In another embodiment, the heteropolyacid may be combined with the solvent as a 1%-5% solution which is then employed in a range of between about 1%-5% by weight, based on the total weight of the phosphoric acid resistant advanced polymaleimide prepolymer composition.

The phosphoric acid resistant advanced polymaleimide prepolymer composition may be prepared by adding the solvent and heteropolyacid to the polymaleimide prepolymer at the conclusion of the advancement reaction. High solids, up to about 80% by weight, and low viscosity compositions of 50 centipoise or less are thereby formed which are acid resistant for days at room temperature or temperatures higher than room temperature.

In addition to the components above, the phosphoric acid resistant advanced polymaleimide prepolymer composition may optionally be mixed at any stage before cure with one or more stabilizers, extenders, fillers, reinforcing agents, pigments, dyestuffs, plasticizers, tackifiers, rubbers, accelerators, diluents or any mixture thereof.

Stabilizers which may be employed include: phenothiazine itself or C-substituted phenothiazines having 1 to 3 substituents or N-substituted phenothiazines having one substituent for example, 3-methyl-phenothiazine, 3-ethyl-phenothiazine, 10-methyl-phenothiazine; 3-phenyl-phenothiazine, 3,7-diphenyl-phenothiazine; 3-chlorophenothiazine, 2-chlorophenothiazine, 3-bromophenothiazine; 3-nitrophenothiazine, 3-aminophenothiazine, 3,7-diaminophenothiazine; 3-sulfonyl-phenothiazine, 3,7-disulfonyl-phenothiazine, 3,7-dithiocyanatophenthiazin; substituted quinines and catechols, copper naphthenate, zinc-dimethyl-dithiocarbonate and phosphotungistic acid hydrate. The stabilizers may be added to the phosphoric acid resistant advanced polymaleimide prepolymer composition in amounts of about 0.1%-10% by weight based on the total weight of advanced polymaleimide prepolymer composition.

Extenders, reinforcing agents, fillers accelerators and pigments which can be employed include, for example: coal tar, bitumen, glass fibers, boron fibers, carbon fibers, cellulose, polyethylene powder, polypropylene powder, mica, asbestos, quartz powder, gypsum, antimony trioxide, bentones, silica aerogel ("aerosil"), lithopone, barite, titanium dioxide, eugenol, dicummyl peroxide, isoeugenol, carbon black, graphite, and iron powder. It is also possible to add other additives, for example, flameproofing agents, flow control agents such as silicones, cellulose acetate butyrate, polyvinyl butyrate, waxes, stearates and the like (which are in part also used as mold release agents) to the advanced polymaleimide prepolymer composition.

The phosphoric acid resistant advanced polymaleimide prepolymer compositions described above are suitable in a broad range of end uses such as in prepregs, laminates of various thicknesses, printed circuit boards, castings, composites, moulded articles, adhesives and coatings.

A prepreg may by obtained by impregnating or coating a base material with the phosphoric acid resistant advanced polymaleimide prepolymer composition. The base material includes all base materials used for laminates. Examples thereof include various glass cloth such as E glass cloth, NE glass cloth and D glass cloth, natural inorganic fiber fabrics, woven fabrics and nonwoven fabrics obtained from liquid crystal fibers such as an aromatic polyamide fiber or an aromatic polyester fiber, woven fabrics and nonwoven fabrics obtained from synthetic fibers such as a polyvinyl alcohol fiber, a polyester fiber or an acrylic fiber, natural fiber nonwoven fabrics such as cotton fabric, linen fabric or felt, a carbon fiber fabric, natural cellulose type fabrics such as kraft paper, cotton paper or paper-glass combined paper, and porous PTFE.

In one embodiment, a polymer base material is impregnated or coated with the advanced polymaleimide prepolymer composition of the present invention. The polymer base material is not specially limited so long as it is a woven fabric, a nonwoven fabric, a sheet or a porous body each of which uses a polymer. Examples thereof include liquid crystal polymers such as lyotropic liquid crystal polymers typified by aromatic polyamide, polyphenylene benzothiazole, thermotropic liquid crystal polymers typified by aromatic polyester, polyesteramide, a polyamide, an aramid resin, polyphenylene ether, polyphenylene sulfide, polyethylene, polypropylene, and a fluororesin. The polymer is properly selected depending upon an intended application or performance as required. These polymers may be used alone or in combination as required. The thickness of the base material is not specially limited. Generally, it is about 3 μm to 200 μm.

The process for producing the prepreg is not specially limited so long as it can combine the phosphoric acid resistant advanced polymaleimide prepolymer composition and a base material to produce the prepreg. In one embodiment, a method is provided in which the above described advanced polymaleimide prepolymer composition is impregnated or applied to the base material and then heated, for example, in a dryer, at 80° C. to 200° C. for 1 to 90 minutes to B-stage the composition and thereby produce prepreg. The resin content of the prepreg may range from about 30%-90% by weight.

A metal-clad laminate may also be obtained by stacking one prepreg or at least two prepregs, laminating metal foil(s), such as copper foil or aluminum foil, on upper and lower surfaces or one surface of the stacked prepreg(s) and heating and pressurizing the resultant set.

General techniques of a laminate and a multilayer board for printed wiring boards may be applied for the molding conditions of the metal-clad laminate. For example, generally, a multiplaten press, a multiplaten vacuum press, continuous molding, an autoclave molding machine or the like is used at a temperature of between about 100° C.-300° C. and a pressure of between about 0.2 MPa-10 MPa, and at a heating time of about 0.1-5 hours. Further, it is also possible to produce a multilayer board by combining the prepreg of the present invention with an internal layer wiring board which is separately prepared and laminate-molding the resultant set.

In a particular embodiment, a prepreg or laminate structure comprises the cured product of a base material impregnated or coated with a phosphoric acid resistant advanced polymaleimide prepolymer composition comprising (i) a polymaleimide prepolymer resulting from the advancement reaction of a polyimide and an alkenylphenol, alkenylphenol ether or mixture thereof in the presence of an amine catalyst; (ii) a solvent; and (iii) a heteropolyacid.

EXAMPLES

Example 1

This example illustrates the preparation of a phosphoric acid resistant advanced polymaleimide prepolymer composition of the present invention.

| Formulation | Parts By Weight |
|---|---|
| N,N'-4,4'-diphenylmethane bismaleimide | 40-45 |
| 4,4'-(methylethylidene)bis(2-propenyl)phenol | 30-35 |
| Tripropylamine | 0.1-1.0 |
| Solvent | 20-30 |
| Phosphotungstic acid hydrate | 0.1-1.0 |

4,4'-(methylethylidene)bis(2-propenyl)phenol was charged to a reactor and placed under vacuum. N,N'-4,4'-diphenylmethane bismaleimide was added to the reactor and mixed with the 4,4'-(methylethylidene)bis(2-propenyl)phenol to form a reaction mixture. The reaction mixture was heated to 132° C. and then placed under vacuum, and upon becoming a clear amber solution, was then cooled to 100° C. Tripropylamine was added to the solution and continuously stirred for 30 minutes. Thereafter, the temperature was increased to and maintained at 120° C. and the solution placed under vacuum for 1.5 hours. The vacuum was removed and the solvent was added to the solution and the temperature was maintained at a temperature of 120° C. until a viscosity of 70-80 poise was reached. The solution was then allowed to cool to 50° C. whereupon phosphotungistic acid hydrate was added. The advanced polymaleimide prepolymer composition which was then discharged from the reactor and cured at 177° C. for 90 minutes then 218° C. for four hours.

Samples of the cured advanced polymaleimide prepolymer composition were then stored at 200° C. and exposed to phosphoric acid for a period of time and the dimensional change and weight loss were measured. The results are presented in Table 1:

TABLE 1

| Days In Storage | % Change X | % Change Y | % Change Z | % Change Weight |
|---|---|---|---|---|
| 1 | 0.00 | −0.57 | 0.00 | −0.27 |
| 7 | 0.00 | 0.00 | 0.00 | 0.05 |
| 31 | 0.00 | 0.00 | 0.00 | 2.40 |

Example 2

A formulation stability study for Example 1 was performed at room temperature and at −4° C. The blended formulation's gel time was initially measured at 171° C. and its viscosity was measured at room temperature. The formulation was then monitored every month until gel. During the study, samples of the formulation were pulled and allowed to adjust to room temperature before the stability data was collected. When stored at −4° C., the formulation demonstrated stability over a 12 month period and thus can be stored at −4° C. for at least one year. In comparison, when stored at room temperature, the formulation demonstrated stability over a 6 month period.

The above-disclosed subject matter is to be considered illustrative, and not restrictive, and the appended claims are intended to cover all such modifications, enhancements, and other embodiments, which fall within the true scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:
1. A phosphoric acid resistant advanced polymaleimide prepolymer composition comprising:
(a) a polymaleimide prepolymer resulting from the advancement reaction of a polyimide containing at least two radicals of the formula

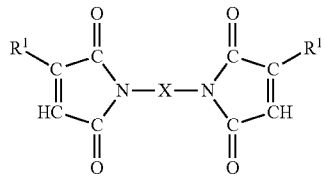

where $R^1$ is hydrogen or methyl and an alkenylphenol, alkenylphenol ether or mixture thereof in the presence of an amine catalyst;
(b) 20-30 parts by weight, based on the total weight of the composition, of a solvent; and
(c) 0.1-1.0 parts by weight, based on the total weight of the composition, of a heteropolyacid
wherein the solvent and the heteropolyacid are added to the polymaleimide prepolymer at the conclusion of the advancement reaction and the phosphoric acid resistant advanced polymaleimide prepolymer composition has a viscosity of 50 centipoise or less.

2. The phosphoric acid resistant advanced polymaleimide prepolymer composition of claim 1 wherein the polyimide is a bismaleimide of the formula

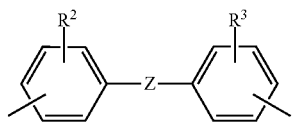

where $R^1$ is hydrogen or methyl and X is $C_nH_{2n}$— with n=2, —$CH_2CH_2SCH_2CH_2$—, phenylene, naphthalene, xylene, cyclopentylene, 1,5,5-trimethyl-1,3-cyclohexylene, 1,4-cyclohexylene, 1,4-bis-(methylene)-cyclohexylene, or groups of the formula (a)

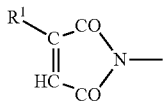

where $R^2$ and $R^3$ independently are chlorine, bromine, methyl, ethyl, or hydrogen and Z is a direct bond, methylene, 2,2-propylidene, —CO—, —O—, —S—, —SO— or —$SO_2$—.

3. The phosphoric acid resistant advanced polymaleimide prepolymer composition of claim 2 wherein $R^1$ is methyl, X is hexamethylene, trimethylhexamethylene, 1,5,5-trimethyl-1,3-cyclohexylene or a group of the formula (a) in which Z is methylene, 2,2-propylidene or —O— and $R^2$ and $R^3$ are hydrogen.

4. The phosphoric acid resistant advanced polymaleimide prepolymer composition of claim 2 wherein the bismaleimide is N,N'-4,4'-diphenylmethane bismaleimide.

5. The phosphoric acid resistant advanced polymaleimide prepolymer composition of claim 1 wherein the alkenylphenol or alkenylphenol ether is a compound of the formulae (1)-(4):

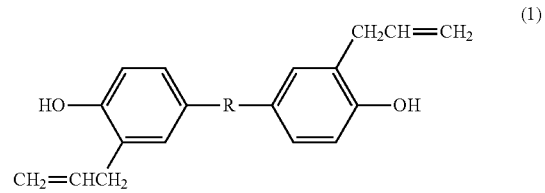

where R is a direct bond, methylene, ispopropylidene, —O—, —S—, —SO— or —$SO_2$—;

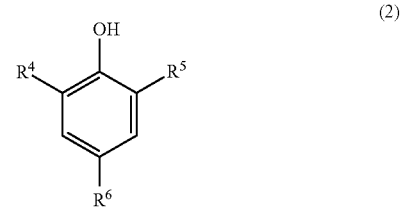

where $R^4$, $R^5$ and $R^6$ are each independently hydrogen or a $C_2$-$C_{10}$ alkenyl with the proviso that at least one of $R^4$, $R^5$ or $R^6$ is a $C_2$-$C_{10}$ alkenyl;

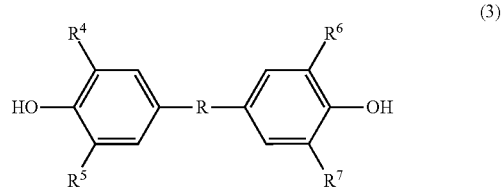

where $R^4$, $R^5$, $R^6$ and $R^7$ are each independently hydrogen or a $C_2$-$C_{10}$ alkenyl with the proviso that at least one of $R^4$, $R^5$, $R^6$ or $R^7$ are is a $C_2$-$C_{10}$ alkenyl and R is defined as in formula (1); and

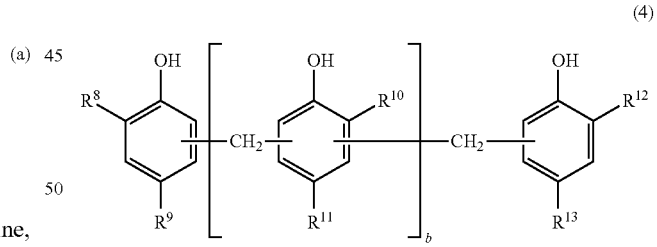

where $R^8$, $R^9$, $R^{10}$, $R^{11}$, $R^{12}$ and $R^{13}$ are each independently hydrogen, $C_1$-$C_4$ alkyl, and $C_2$-$C_{10}$ alkenyl with the proviso that at least one of $R^8$, $R^9$, $R^{10}$, $R^{11}$, $R^{12}$ and $R^{13}$ is a $C_2$-$C_{10}$ alkenyl and b is an integer from 0 to 10.

6. The phosphoric acid resistant advanced polymaleimide prepolymer composition of claim 1 wherein the heteropolyacid is phosphotungstic acid hydrate.

7. The phosphoric acid resistant advanced polymaleimide prepolymer composition of claim 1 wherein the solvent is acetone.

8. A prepreg or laminate structure comprising the cured product of a fabric or fiber impregnated or coated with a phosphoric acid resistant advanced polymaleimide prepolymer composition comprising:

(a) a polymaleimide prepolymer resulting from the advancement reaction of a polyimide containing at least two radicals of the formula

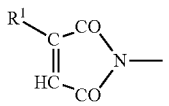

where $R^1$ is hydrogen or methyl and an alkenylphenol, alkenylphenol ether or mixture thereof in the presence of an amine catalyst;
(b) 20-30 parts by weight, based on the total weight of the composition, of a solvent; and
(c) 0.1-1.0 parts by weight, based on the total weight of the composition, of a heteropolyacid wherein the solvent and the heteropolyacid are added to the polymaleimide prepolymer at the conclusion of the advancement reaction and the phosphoric acid resistant advanced polymaleimide prepolymer composition has a viscosity of 50 centipoise or less.

* * * * *